US012771354B2

(12) United States Patent
Enthoven et al.

(10) Patent No.: US 12,771,354 B2
(45) Date of Patent: Oct. 20, 2026

(54) BIAS VOLTAGE GENERATOR

(71) Applicant: TECHNISCHE UNIVERSITEIT DELFT, Delft (NL)

(72) Inventors: Lucas Alexander Enthoven, Delft (NL); Fabio Sebastiano, Delft (NL); Masoud Babaie, Delft (NL)

(73) Assignee: TECHNISCHE UNIVERSITEIT DELFT, Delft (NL)

( * ) Notice: Subject to any disclaimer, the term of this patent is extended or adjusted under 35 U.S.C. 154(b) by 0 days.

(21) Appl. No.: 18/871,379

(22) PCT Filed: May 30, 2023

(86) PCT No.: PCT/NL2023/050302
§ 371 (c)(1),
(2) Date: Dec. 3, 2024

(87) PCT Pub. No.: WO2023/234775
PCT Pub. Date: Dec. 7, 2023

(65) Prior Publication Data

US 2025/0150084 A1 May 8, 2025

(30) Foreign Application Priority Data

Jun. 3, 2022 (NL) ...................................... 2032078

(51) Int. Cl.
*H03K 19/195* (2006.01)
*B82Y 10/00* (2011.01)
*G06N 10/40* (2022.01)
*H03M 1/12* (2006.01)

(52) U.S. Cl.
CPC ............ *H03K 19/195* (2013.01); *B82Y 10/00* (2013.01); *G06N 10/40* (2022.01); *H03M 1/12* (2013.01)

(58) Field of Classification Search
CPC ...... H03K 19/195; B82Y 10/00; G06N 10/40; H03M 1/12
USPC ......... 341/50, 118, 161, 165, 154, 145, 153; 326/5
See application file for complete search history.

(56) References Cited

U.S. PATENT DOCUMENTS 10,635,990 B1 * 4/2020 Park ..................... G11C 27/024

OTHER PUBLICATIONS

Geck Lotte et al. "Quantum Science and Technology Paper @Bullet Open Access Control electronics for semiconductor spin qubits", Quantum Sci. Technol, Jan. 1, 2020, p. 15004.
Ian Conway Lamb: "Cryogenic Control Beyond 100 Qubits", Master of Science in Physics thesis, School of Physics, Dec. 31, 2016, pp. 1-103.

(Continued)

*Primary Examiner* — Arnold M Kinkead
(74) *Attorney, Agent, or Firm* — AEON Law, PLLC; Adam L. K. Philipp; Charlotte E. Holoubek

(57) ABSTRACT

The invention provides a bias voltage generator device comprising a voltage ramp generator for generating a voltage ramp and coupled to a series of terminals for providing a set bias voltage to each terminal, wherein each terminal is coupled to the voltage ramp generator via a sample-and-hold circuit (S&H) for holding a sampled voltage, and a controller adapted to switch each sample-and-hold circuit at a set time to the voltage ramp generator to set the sampled voltage as the set bias voltage, with the voltage ramp generator adapted to provide the voltage ramp to span a required set bias voltage range.

18 Claims, 3 Drawing Sheets

(56) References Cited

OTHER PUBLICATIONS

International Search Report and Written Opinion, for Application No. PCT/NL2023/050302, mailed on Aug. 9, 2023, 9 Pages.

Vliex p et al. "Bias Voltage DAC Operating at Cryogenic Temperatures for Solid-State Qubit Applications", IEEE Solid-State Circuits Letters, IEEE, vol. 3, Jul. 22, 2020 (Jul. 22, 2020), pp. 218-221.

* cited by examiner

BIAS VOLTAGE GENERATOR

RELATED APPLICATIONS

This application is a national entry of PCT International Patent Application No. PCT/NL2023/050302, filed May 30, 2023, in the name of "TECHNISCHE UNIVERSITEIT DELFT." [NL], which PCT application claims the benefit of priority of Netherlands Patent Applications Serial No. 2032078, filed Jun. 3, 2022, in the name of "TECHNISCHE UNIVERSITEIT DELFT." [NL]. The entire contents of the above-referenced applications and of all priority documents referenced in the Application Data Sheet filed herewith are hereby incorporated by reference for all purposes.

FIELD OF THE INVENTION

The invention relates to a bias voltage generator.

BACKGROUND OF THE INVENTION

There are many applications that require a series of different, stable bias voltages. In particular in cryogenic or partly cryogenic applications, problems arise.

One of these cryogenic applications relate to semiconductor spin qubits.

Semiconductor spin qubits present a promising, scalable qubit platform for quantum computing. In each spin qubit, several gate electrodes electrostatically confine electrons (or holes) in quantum dots, cooled to sub-Kelvin temperatures for proper operation. As today's quantum processors comprise only a few spin qubits (<10), all electrodes can be wired to room-temperature electronics for the biasing, driving, and readout of the qubits. However, this approach is not scalable to future million-qubit quantum computers due to the unfeasibly large number of wires necessary. Thus, the electronic interface should be operated at cryogenic temperatures close to the qubits, ideally on the same chip. Such cryogenic electronics must dissipate very low power to comply with the cooling budget of cryogenic refrigerators (<1 mW at T<0.1K) while ensuring high accuracy and low noise not to degrade the qubit performance, thus calling for power-efficient solutions. Each spin-qubit electrode requires a low-noise high-accuracy DC bias voltage that must be individually calibrated to compensate for fabrication and material variability. Moreover, calibration routines for spin qubits require monotonicity of the biasing circuit to avoid control-loop instability.

Prior solutions have shown that the same bias generator can be multiplexed over several electrodes using capacitive sample-and-hold (S/H) circuits that are periodically refreshed to counteract leakage, see, for instance, S. J. Pauka et al., Nature Electronics, Vol. 4, January 2021, pp. 64-70: "Scaled-up quantum computers will require control interfaces capable of the manipulation and readout of large numbers of qubits, which usually operate at millikelvin temperatures. Advanced complementary metal-oxide-semiconductor (CMOS) technology is an attractive platform for delivering such interfaces. However, this approach is generally discounted due to its high power dissipation, which can lead to the heating of fragile qubits. Here we report a CMOS-based platform that can provide multiple electrical signals for the control of qubits at 100 mK. We demonstrate a chip that is configured by digital input signals at room temperature and uses on-chip circuit cells that are based on switched capacitors to generate static and dynamic voltages for the parallel control of qubits. We use our CMOS chip to bias a quantum dot device and to switch the conductance of a quantum dot via voltage pulses generated on the chip. Based on measurements from six cells, we determine the average power dissipation for generating control pulses of 100 mV to be 18 nW per cell. We estimate that a scaled-up system containing a thousand cells could be cooled by a commercially available dilution refrigerator."

According to P. Vliex et al., IEEE Solid-State Circuits Letters, Vol. 3, 2020, pp. 218-221:

"A scalable eight channel DAC designed in a TSMC 65-nm CMOS technology for generation of solid-state quantum bit (qubit) bias voltages is presented. Measurement results of the DAC and some additional auxiliary components like an on-chip amplifier and sigma-delta modulator at 6 K are discussed. With a low-power consumption of 2.7 μW per channel, the DAC fulfills the requirements to be placed next to qubits inside a mixing chamber of a dilution refrigerator, showing a promising way for scaling qubit numbers toward a quantum computer."

While the approach by P. Vliex et al. reduces the power dissipated per electrode to about ~3 μW/electrode, these solutions can however only support less than 400 electrodes due to the tight cooling-power budget.

According to W. I. L Lawrie et al., Applied Physics Letters 116, 080501 (2020): "Electrons and holes confined in quantum dots define excellent building blocks for quantum emergence, simulation, and computation. Silicon and germanium are compatible with standard semiconductor manufacturing and contain stable isotopes with zero nuclear spin, thereby serving as excellent hosts for spins with long quantum coherence. Here, we demonstrate quantum dot arrays in a silicon metal-oxidesemiconductor (SiMOS), strained silicon (Si/SiGe), and strained germanium (Ge/SiGe). We fabricate using a multi-layer technique to achieve tightly confined quantum dots and compare integration processes. While SiMOS can benefit from a larger temperature budget and Ge/SiGe can make an Ohmic contact to metals, the overlapping gate structure to define the quantum dots can be based on a nearly identical integration. We realize charge sensing in each platform, for the first time in Ge/SiGe, and demonstrate fully functional linear and twodimensional arrays where all quantum dots can be depleted to the last charge state. In Si/SiGe, we tune a quintuple quantum dot using the N þ 1 method to simultaneously reach the few electron regime for each quantum dot. We compare capacitive crosstalk and find it to be the smallest in SiMOS, relevant for the tuning of quantum dot arrays. We put these results into perspective for quantum technology and identify industrial qubits, hybrid technology, automated tuning, and two-dimensional qubit arrays as four key trajectories that, when combined, enable fault-tolerant quantum computation."

Since such circuits are fabricated using nanometer CMOS processes for future compatibility with the advanced spin-qubit fabrication, their output bias range is well below the nominal supply, e.g., <1V, despite spin qubits requiring bias voltages up to 3V.

According to Lotte Geck et al., Quantum Science and Technology PAPER @BULLET OPEN ACCESS Control electronics for semiconductor spin qubits", Quantum Sci. Technol, 1 Jan. 2020 (2020 Jan. 1), page 15004: "Future universal quantum computers solving problems of practical relevance are expected to require at least 106 qubits, which is a massive scale-up from the present numbers of less than 50 qubits operated together. Out of the different types of qubits, solid state qubits are considered to be viable candidates for this scale-up, but interfacing to and controlling such a large number of qubits is a complex challenge that has not been solved yet. One possibility to address this challenge is to use qubit control circuits located close to the qubits at cryogenic temperatures. In this work we evaluate the feasibility of this idea, taking as a reference the physical requirements of a two-electron spin qubit and the specifications of a standard 65 nm complementary metal-oxide-semiconductor process. Using principles and flows from electrical systems engineering we provide realistic estimates of the footprint and of the power consumption of a complete control-circuit architecture. Our results show that with further research it is possible to provide scalable electrical control in the vicinity of the qubit, with our concept."

WO2022/055578 in its abstract states: "Systems and methods related to low power cryo-CMOS circuits with non-volatile threshold voltage offset compensation are provided. A system (700) includes a plurality of devices (760) configured to operate in a cryogenic environment (<300 K), where a first distribution of a threshold voltage associated with the plurality of devices (760) has a first value indicative of a measure of spread of the threshold voltage. The system (700) further includes control logic (712, 714), coupled to each of the plurality of devices (760), configured to modify (714out) a threshold voltage associated with each of the plurality of devices (760) such that the first distribution is changed to a second distribution having a second value of the measure of spread of the threshold voltage representing a lower variation among threshold voltages of the plurality of devices."

SUMMARY OF THE INVENTION

A problem of known voltage generators is a stable provision of bias voltages to larger series of devices.

Hence, it is an aspect of the invention to provide an alternative bias voltage generator, which preferably further at least partly obviates one or more of above-described drawbacks.

There is provided a bias voltage generator device comprising a voltage ramp generator for generating a voltage ramp and coupled to a series of terminals for providing a set bias voltage to each terminal, wherein each terminal is coupled to the voltage ramp generator via a sample-and-hold circuit (S&H) for holding a sampled voltage, and a controller adapted to switch each sample-and-hold circuit at a set time to the voltage ramp generator to set the sampled voltage as the set bias voltage, with the voltage ramp generator adapted to provide the voltage ramp spanning a required set bias voltage range.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
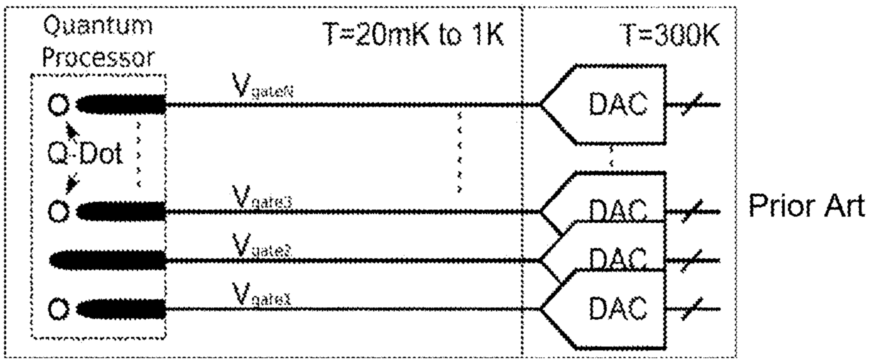
FIG. 1 schematically depicts a bias voltage generator according to a state of the art.

The drawings are not necessarily on scale.

DETAILED DESCRIPTION OF THE INVENTION

The present bias voltage generator in particular allows providing a series of different DC bias voltages to be applied on a series of terminals. In particular, efficient biasing of a large number of devices can be provided. In fact, the voltage generator is able to apply different bias voltages to many hundreds of devices. In an embodiment, the voltage generator can provide bias voltages to thousands of devices. In particular, many different bias voltages values can be provided. In an embodiment, more than hundred different bias voltage values can be provided simultaneously to many devices. In an embodiment, this can be done while minimizing the power and the form factor of the required circuit. While prior art utilizes a large number of voltage generators operating in parallel, or proposed power-hungry voltage generators that can serve several devices in sequence, the present bias voltage generator provides a single power-efficient voltage generator that can be seamlessly multiplexed over a large number of channels.

A digital-to-analog converter (DAC, D/A, D2A, or D-to-A) is a system that converts a digital signal into an analog signal.

There are several DAC architectures. Due to the complexity and the need for precisely matched components, all but the most specialized DACs are implemented as integrated circuits (ICs). These typically take the form of metal-oxide-semiconductor (MOS) mixed-signal integrated circuit chips that integrate both analog and digital circuits. (free according to Wikipedia)

Discrete DACs (circuits constructed from multiple discrete electronic components instead of a packaged IC) would typically be extremely high-speed low-resolution power-hungry types, as used in military radar systems. Very high-speed test equipment, especially sampling oscilloscopes, may also use discrete DACs. A sample and hold (S&H, also known as sample and follow) circuit is an analog device that samples (captures, takes) the voltage of a continuously varying analog signal and holds (locks, freezes) its value at a constant level for a specified minimum period of time.

A typical sample and hold circuit stores electric charge in a capacitor and may contain at least one switching device such as a FET (field effect transistor) switch and often one operational amplifier. In general, to sample the input signal the switch connects the capacitor to the output of a buffer amplifier. The buffer amplifier charges or discharges the capacitor so that the voltage across the capacitor is practically equal, or proportional to, input voltage. In hold mode the switch disconnects the capacitor from the buffer. (free according to Wikipedia)

The cascode is a two-stage amplifier that has a common-emitter stage feeding into a common-base stage. Compared to a single amplifier stage, this combination may have one or more of the following characteristics: higher input-output isolation, higher input impedance, high output impedance, higher bandwidth. The cascode is often constructed from two transistors (BJTs or FETs), with one operating as a common emitter or common source and the other as a common base or common gate. The cascode can improve input-output isolation (reduces reverse transmission), as there is no direct coupling from the output to input. This may eliminates the Miller effect and thus contributes to a much higher bandwidth. (Based upon Wikipedia)

In an embodiment, the controller switches said sample-and-hold circuit periodically for coupling to said voltage ramp generator for resampling the set bias voltages periodically to counteract parasitic effects, such as leakage.

In an embodiment, the controller is adapted for coupling multiple sample-and-hold circuits simultaneously to the voltage ramp generator for providing the same set bias voltage to multiple terminals coupled to these multiple sample-and-hold circuits.

In an embodiment, the voltage ramp generator comprises a digital-to-analogue converter (DAC) having an output coupled to each of said series of terminals via the sample-and-hold circuits for providing the set bias voltage to each terminal.

In an embodiment, the voltage ramp generator comprises an integrating digital-to-analogue converter (DAC), in particular comprising multiple input capacitors.

In an embodiment, the voltage ramp generator comprises an integrating digital-to-analogue converter (DAC) with variable slope, in particular comprising This is specific of the particular switched-capacitor implementation.

In an embodiment, the voltage ramp generator is adapted for providing a voltage with a variable slope over time, for moving faster over voltage ranges that are not needed by any of the output terminals, or the voltage ramp generator is adapted for providing discontinuous voltage ranges or completely skip voltage ranges. This can be used to optimize the speed in sweeping the whole voltage range, or other performance parameters, such as the output noise of the voltage generator or the requirements on the synchronization between the voltage generator and the sample-and-holds. voltage ramp generator comprises a switched capacitor integrator.

In an embodiment, the voltage generator comprises at least one selected from a variable input capacitance, a variable integrator input, a variable integrating capacitor and a combination thereof for dynamically changing the slope of the voltage ramp.

In an embodiment, the voltage ramp generator comprises an amplifier comprising a dynamically biased output stage connected to a higher supply voltage for generating a voltage ramp that goes above the nominal supply voltage (VDD) of the adopted fabrication process.

In an embodiment, the voltage ramp generator comprises an output stage comprising cascode transistors, the output stage adapted for operating in a nominal operating region, in particular wherein the bias voltages of the cascode transistors change as function of the output voltage ramp, which allow the devices in the output stage to operate in their nominal operating region.

In an embodiment, the bias voltages of the output stage cascode transistors are generated on-chip using the higher supply, a supply that is higher than the nominal supply voltage of the adopted process.

In an embodiment, diode connected transistors and cascode transistors with proper bias voltages are used in the circuit supplied by a supply voltage higher than the nominal supply voltage for the adopted process connected to VDD In the circuit connected to a higher supply, are used to guarantee all transistors operate in their nominal operating region.

In an embodiment, the generated bias voltage depends on the threshold voltage of a transistor, such that it is robust against variations of the threshold voltage when operating at cryogenic temperatures In an embodiment, the Sample-and-hold circuits comprise a demultiplexer (DEMUX).

In an embodiment, the sample-an-hold circuits and voltage ramp generator are implemented as an integrated circuit.

There is further provided a method for providing a series of set voltages to a series of components, comprising providing a series of terminals each provided with a sample-and-hold circuit, each sample-and-hold circuit individually switchably coupled to a voltage ramp generator, and a controller for switching each sample-and-hold circuit at a set time to the voltage ramp generator for setting the sampled voltage as the set bias voltage, wherein said controller is operated for providing a set bias voltage to each of the series of terminals.

There is further provided the use of a bias voltage generator for providing a series of set voltages to a series of cryogenic components, in particular quantum computing devices, for instance a set of spin qubits, quantum dots, quantum-dot based qubits, or quantum sensors.

The bias voltage generator comprises a controller for switching each sample-and-hold circuit at a set time to the voltage ramp generator for setting the sampled voltage as the set bias voltage. The controller to that end is adapted to switch or configured to switch each S&H circuit. This sets the sampled voltage as the set bias voltage.

The voltage ramp generator provides the voltage ramp spanning a required set bias voltage range. The voltage ramp generator to that end is adapted to provide of configured to provide the voltage ramp to span or spanning a required set bias voltage range.

The term "substantially" herein, such as in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

The term "functionally" will be understood by, and be clear to, a person skilled in the art. The term "substantially" as well as "functionally" may also include embodiments with "entirely", "completely", "all", etc. Hence, in embodiments the adjective functionally may also be removed. When used, for instance in "functionally parallel", a skilled person will understand that the adjective "functionally" includes the term substantially as explained above. Functionally in particular is to be understood to include a configuration of features that allows these features to function as if the adjective "functionally" was not present. The term "functionally" is intended to cover variations in the feature to which it refers, and which variations are such that in the functional use of the feature, possibly in combination with other features it relates to in the invention, that combination of features is able to operate or function. For instance, if an antenna is functionally coupled or functionally connected to a communication device, received electromagnetic signals that are received by the antenna can be used by the communication device. The word "functionally" as for instance used in "functionally parallel" is used to cover exactly parallel, but also the embodiments that are covered by the word "substantially" explained above. For instance, "functionally parallel" relates to embodiments that in operation function as if the parts are for instance parallel. This covers embodiments for which it is clear to a skilled person that it operates within its intended field of use as if it were parallel.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices or apparatus herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of an integrated circuit. In the device or apparatus claims enumerating several means, several of these means may be embodied by one and the same item of hardware. The mere fact that certain measures are recited in mutually different dependent claims does not indicate that a combination of these measures cannot be used to advantage.

The invention further applies to an apparatus or device comprising one or more of the characterising features described in the description and/or shown in the attached drawings. The invention further pertains to a method or process comprising one or more of the characterising features described in the description and/or shown in the attached drawings.

The various aspects discussed in this patent can be combined in order to provide additional advantages. Furthermore, some of the features can form the basis for one or more divisional applications.

DESCRIPTION OF EMBODIMENTS

FIG. 1 schematically depicts an example of a prior art bias voltage generator. It comprises a series of digital-to-analogue converters (DACs) as a DC bias voltage generator. For each terminal, a DAC is provided. Each terminal in this prior art embodiment is coupled for driving in this embodiment a quantum dot. These quantum dots and the terminals operate under cryogenic conditions. The DACs are all operated under non-cryogenic conditions, mostly room temperature conditions.

To address the challenges describes earlier, a bias voltage generator is proposed which achieves a wide output range and a low power dissipation largely independent of the number of driven electrodes. Those advances are enabled by the use of an integrating digital to analogue convertor (DAC) architecture and the use of a robust digitally-assisted high-voltage output stage.

Figure 2:
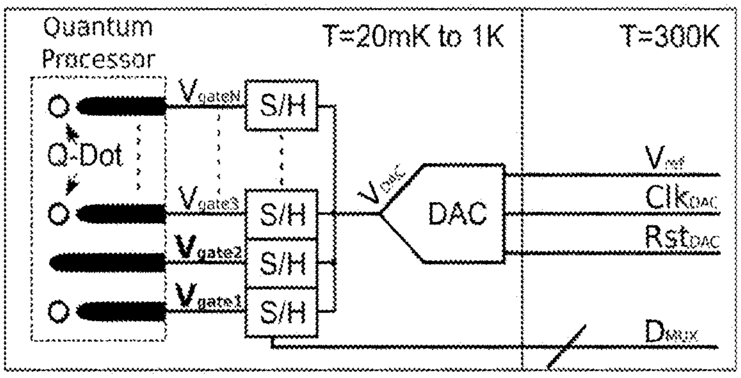
FIG. 2 shows an embodiment of a bias voltage generator.
Figure 3:
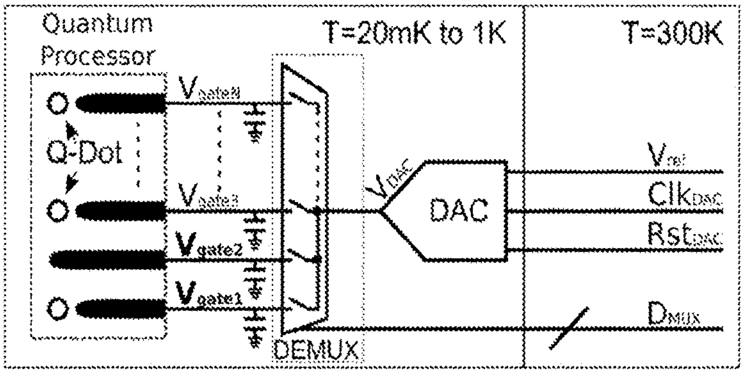
FIG. 3 illustrates an embodiment of a bias voltage generator using a demultiplexer.

FIG. 2 shows an embodiment of a bias voltage generator as currently proposed. To maximize scalability, the proposed DAC outputs a voltage ramp covering the full required bias range. The voltage required by each specific electrode is in this embodiment sampled at the right time using a controller. In the embodiment of FIG. 3, the bias voltage is set by an analog demultiplexer and is held on a capacitor. Unlike prior DACs that generate a specific voltage for each electrode separately, the power dissipation of the proposed DAC is independent of the number of driven electrodes. Any number of electrodes can be driven, as long as the total capacitance contributed by the demultiplexer and its interconnect does not exceed the maximum DAC load capacitance. Since the DAC must only compensate for the hold-capacitor charge lost by leakage, the requirements on the loading and settling are relaxed, thus allowing to serve a large number of electrodes with a low power and to drive the same voltage to multiple sample-and-hold circuits (S/Hs) in parallel. When used in cryogenic conditions the required refresh rate is typically below 1 Hz due to the extremely low leakage at cryogenic temperatures (<0.2 μV/s), the requirements on the maximum duration of the voltage ramp (tbias in FIG. 4 upper curve) are relaxed, so that the circuit speed can be optimized for power consumption.

Figure 4:
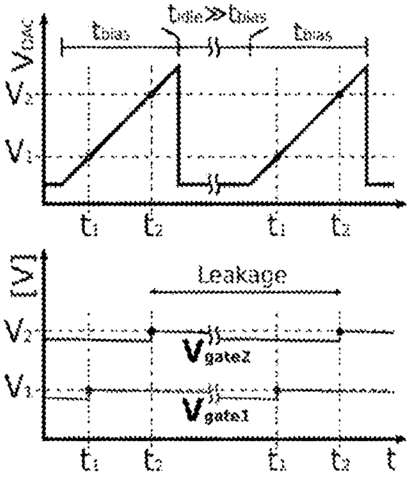
FIG. 4 shows the waveforms of the voltage at different circuit nodes in the circuit shown in FIG. 2 and FIG. 3.

In FIG. 4, in the curves examples of various voltages of the bias voltage generator of FIG. 2 and FIG. 3 are shown. V1 and V2 are respectively the voltage levels necessary to bias the electrode voltages Vgate1 and Vgate2.

The upper time curve shows the voltage resulting from the ramp voltage generator, here the DAC. At t1 and t2, the switches are activated and the S&H circuits sample to provide V1 and V2 to the respective terminals.

Figure 5:
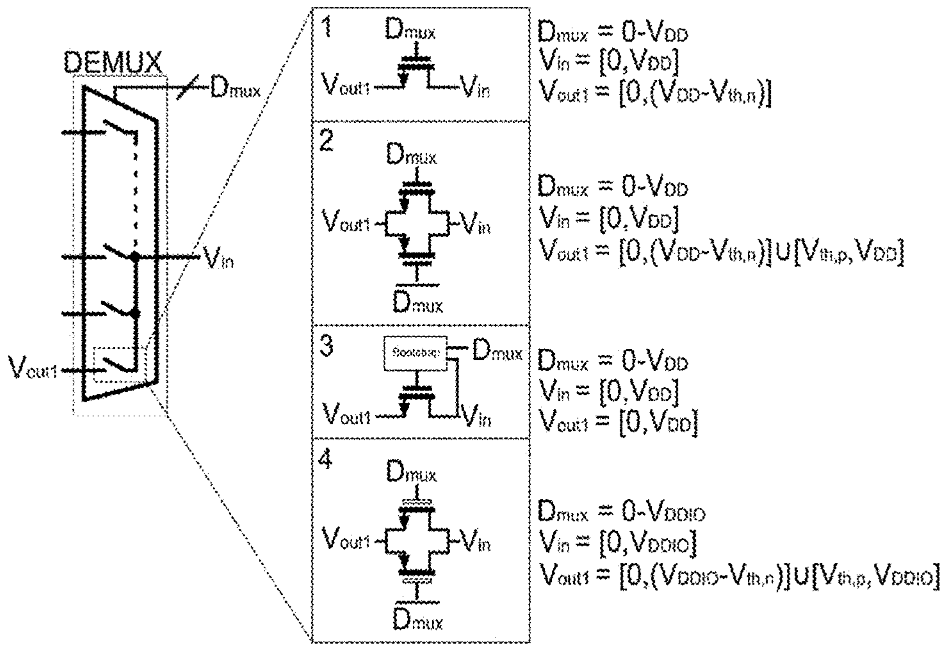
FIG. 5 shows an embodiment of a demultiplexer for the bias voltage generator.

FIG. 5 shows various implementations of the switches in the demultiplexer. The upper implementation, indicated as 1, shows a single NMOS switch which can pass a voltage between [0, $V_{DD}-V_{th,n}$] to $V_{out}$. It is noted that $V_{DD}$ is the supply voltage and $V_{th,n}$ and $V_{th,p}$ are the threshold voltages for the NMOS and PMOS, respectively.

The next implementation, indicated as 2, shows a passgate with NMOS and complementary PMOS switch, here the NMOS can pass a voltage between [0, $V_{DD}-V_{th,n}$] to $V_{out}$ and the PMOS can pass a voltage between [$V_{th,p}$, $V_{DD}$] to $V_{out}$. At cryogenic temperatures the threshold voltage of the NMOS and PMOS transistor will increase which means that implementation 1 and 2 may have a limited range of voltages they can pass to $V_{out}$.

Another implementation is designed to work around this. The implementation indicated as 3 has a single NMOS switch which can be bootstrapped such that $V_{in}+V_{DD}$ is put on the gate as shown. Alternatively, indicated in implementation 4 of FIG. 5, a pass gate can be made using thick oxide devices. While these thick oxide devices also suffer from increased threshold voltage, the supply with which these are switched ($V_{DDIO}$ instead of $V_{DD}$) is higher which makes them more robust. This typically allows them to pass the full range between [0, $V_{DD}$]

Figure 6:
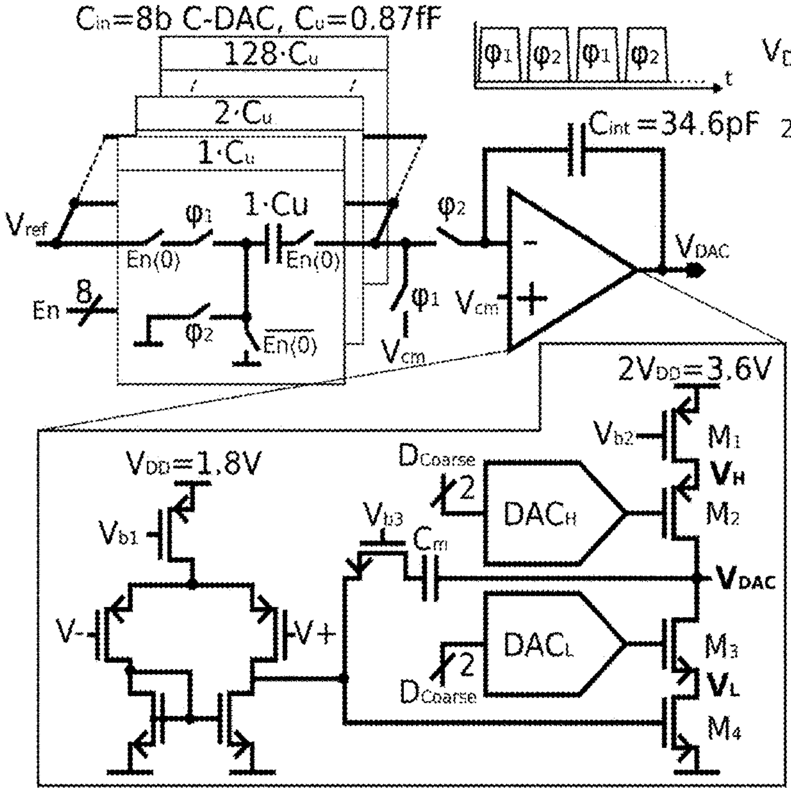
FIG. 6 depicts an embodiment of a digital-to-analogue converter (DAC) for the present bias voltage generator.

FIG. 6 shows an embodiment of the voltage generator in which the DAC can be implemented as a switched-capacitor integrator supplied with a reference voltage (Vref) at the input to generate a ramp with fixed, discrete steps at the output. The availability of time-discrete steps relaxes the synchronization with the demultiplexer of FIG. 3. Since variations in the integrator input capacitance ($C_{in}$) or the integration capacitor (Cint) only cause gain errors, the integrating-DAC architecture is inherently monotonic. This enables for example seamless spin-qubit calibration even for high DAC resolutions. The integrator step size can be dynamically adjusted by varying Cin ('gear shifting'). Cin can be implemented as a capacitive DAC. This gear shifting allows reaching the target output voltages faster by increasing the step size to skip over unused voltage codes, since the electrodes may need non-uniformly distributed voltages over the output range. Thanks to the lower number of integration cycles, the output noise improves since the noise accumulated in Cint scales with the number of integration cycles.

As an example embodiment, the design is implemented in a 22 nm FinFET technology with a nominal supply voltage $V_{DD}$=1.8V for thick-oxide devices, therefore making the target range of 3V non-trivial to implement. To address this, a two-stage thick-oxide Miller amplifier with a high-voltage output stage is employed (circuit diagram in the bottom box in FIG. 6). While the input stage is supplied by the nominal $V_{DD}$, which is assumed to be equal to 1.8 V in this example, the output stage is supplied by $2 \cdot V_{DD}$=3.6V, allowing for an output voltage $V_{DAC}$ up to 3.3V, by taking into account some voltage margin from the supply for proper operation of the output stage. For reliable operation, all voltages across the output-stage devices are kept within the safe operating region by adding cascodes $M_2$ and $M_3$, whose gates are dynamically biased during the output ramp. The amplifier input is shielded from the high-voltage output by the MOM capacitor Cint, which has a higher compliance voltage, allowing for a $V_{DAC}$ range of 0.3-3.3V for $V_{CM}$=0.3V. The high-voltage output stage can be designed for a very large capacitive output load to drive the large load due to the demultiplexer. For instance, by designing the amplifier for an output load above 500 pF would enable driving more than 10,000 electrodes based on parasitic capacitance estimations.

Figure 7:
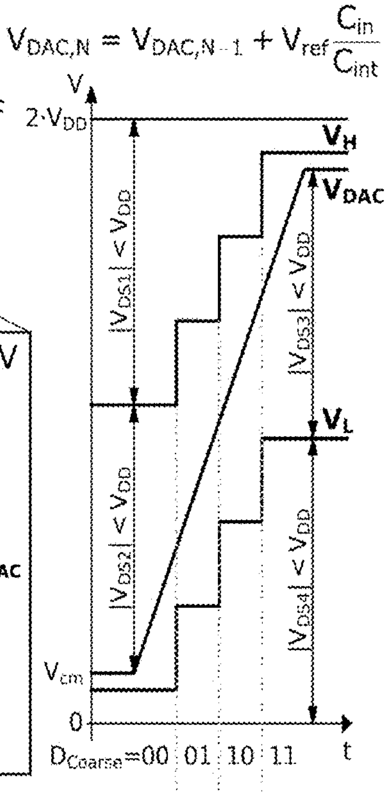
FIG. 7 shows a voltage curve indicating the output voltage of the DAC in FIG. 6 with the achievable output voltage range and other relevant voltages in that circuit.
Figure 8:
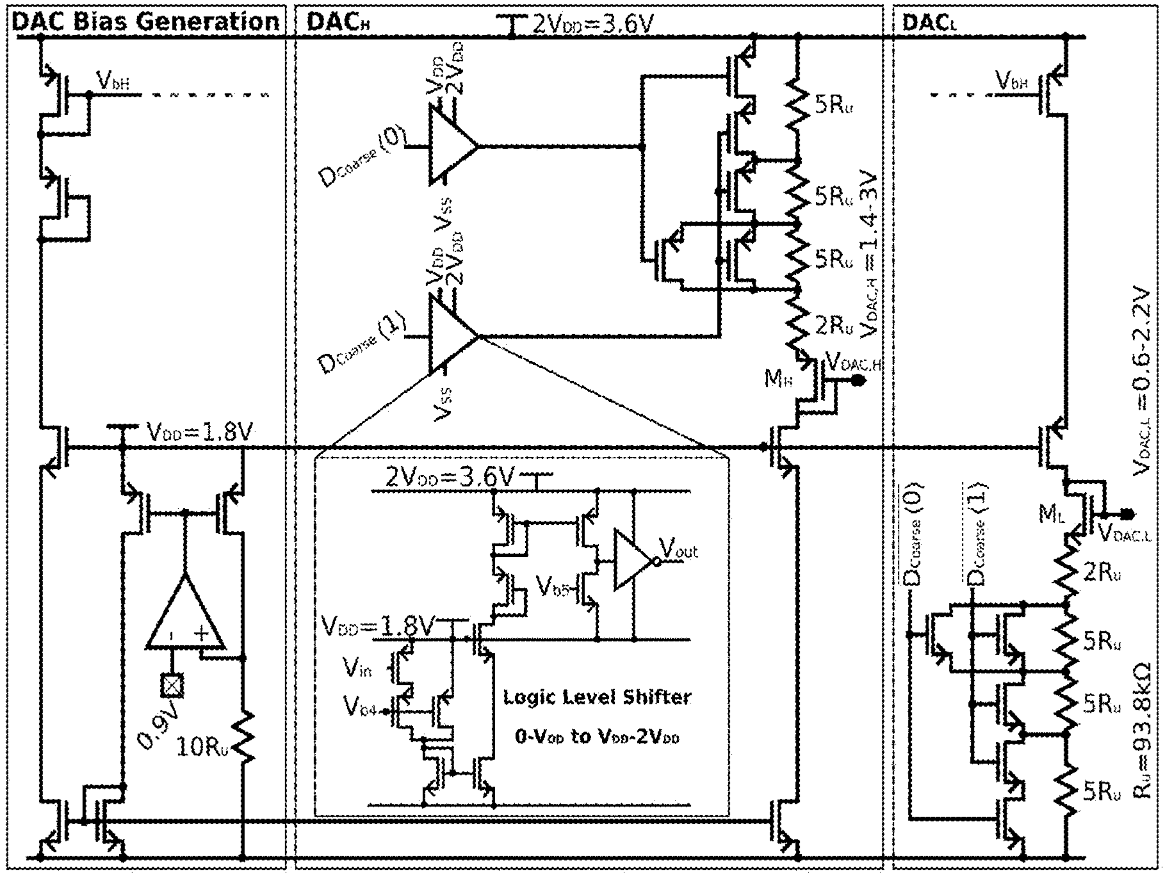
FIG. 8 shows an embodiment of the DAC used to bias the cascodes of an amplifier output stage, as the one shown in FIG. 6

In FIG. 8, a specific implementation of an integrating digital-to-analog convertor (DAC) is illustrated for implementing the bias generator. It illustrates the multiple input capacitors which can be used to generate different slope steepness at the output. The two-stage amplifier has an output stage that is dynamically biased as shown in FIG. 7.

As indicated in FIG. 7, the targeted $V_{DAC}$ exemplary range of 0.3-3.3V requires biasing $V_L$ ($V_H$) between 0.2-1.8V (1.8-3.4V), which translates into coarse DACs' output between 0.6-2.2V (1.4-3.0V). This requires the $2 \cdot V_{DD}$ supply to be used. Thanks to a large margin in voltage headroom, the coarse DAC's operation is largely insensitive to synchronization errors, and voltage compliance is here ensured by only 4 levels for the voltages at the source of the cascodes in the output stage $V_H$, $V_L$. This can be implemented by 2b thin-film resistive ladders, as shown in FIG. 8. Diode-connected transistors $M_H$ and $M_L$ in series with each ladder shift the DAC voltage by replicating the VGS of the output-stage cascodes. This ensures robustness to any threshold-voltage shift, as a significant threshold-voltage increase is expected at cryogenic temperatures and no cryogenic thick-oxide device models were available during design.

In the coarse-DAC's branches, the voltages across transistors is kept below $V_{DD}$ by using cascode transistors with the gate to $V_{DD}$ or diode-connected series transistors. To drive the PMOS switches in $DAC_H$, a logic level shifter translates 0-1.8V signals to the 1.8-3.6V domain.

Figure 9:
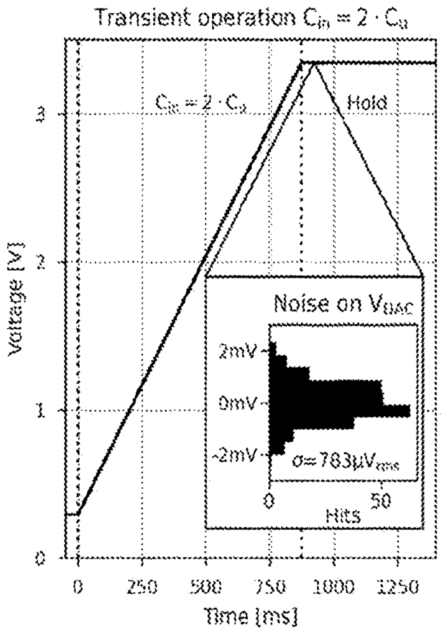
FIGS. 9 and 10 illustrate example of the previously described gear shifting of FIG. 6.
Figure 10:
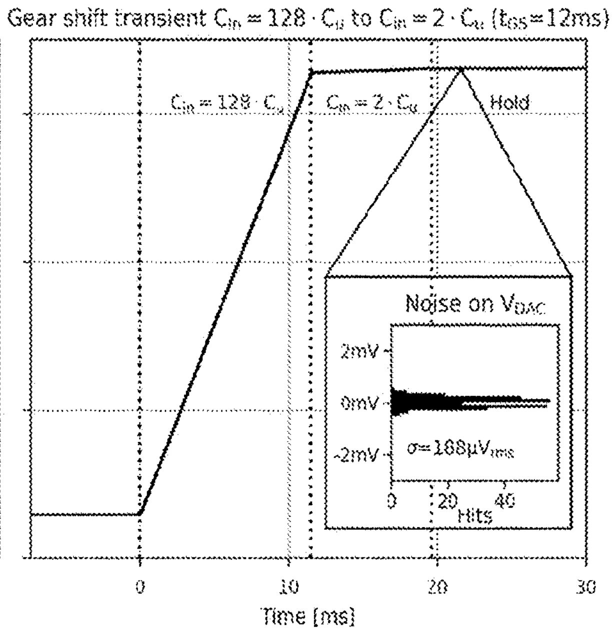

Example of the previously described gear shifting are illustrated in FIGS. 9 and 10. In FIG. 9, the transient of the output signal is measured for an input capacitance of 2 $C_u$. Generating the full slope that has a range of 3V takes more than 0.8 s and has a noise performance of 783 $\mu V_{rms}$.

Reaching the full scale output voltage can be done faster (0.02 s) and with less noise of 188 $\mu V_{rms}$, which is limited by the measurement setup. This is achieved, as illustrated in FIG. 10, by first making large steps in the slope by setting the input capacitance to 128 $C_u$. This causes a steeper output slope, and thus reduces the available voltage resolution. When a higher resolution in the output slope is required, the input capacitance can be set to 2 $C_u$ to generate finer and higher resolution steps. This is demonstrated in FIG. 10.

It will also be clear that the above description and drawings are included to illustrate some embodiments of the invention, and not to limit the scope of protection. Starting from this disclosure, many more embodiments will be evident to a skilled person. These embodiments are within the scope of protection and the essence of this invention and are obvious combinations of prior art techniques and the disclosure of this patent.

The invention claimed is:

1. A bias voltage generator device comprising a voltage ramp generator for generating a voltage ramp and coupled to a series of terminals for providing a set bias voltage to each terminal, wherein each terminal is coupled to the voltage ramp generator via a sample-and-hold circuit (S&H) for holding a sampled voltage, and a controller adapted to switch each sample-and-hold circuit at a set time to the voltage ramp generator to set the sampled voltage as the set bias voltage, with the voltage ramp generator adapted to provide the voltage ramp to span a required set bias voltage range; wherein the controller is adapted to couple multiple sample-and-hold circuits simultaneously to the voltage ramp generator to provide the same set bias voltage to multiple terminals coupled to these multiple sample-and-hold circuits.

2. A bias voltage generator device comprising a voltage ramp generator for generating a voltage ramp and coupled to a series of terminals for providing a set bias voltage to each terminal, wherein each terminal is coupled to the voltage ramp generator via a sample-and-hold circuit (S&H) for holding a sampled voltage, and a controller adapted to switch each sample-and-hold circuit at a set time to the voltage ramp generator to set the sampled voltage as the set bias voltage, with the voltage ramp generator adapted to provide the voltage ramp to span a required set bias voltage range;

wherein the controller is adapted to switch said sample-and-hold circuit periodically to couple to said voltage ramp generator to resample the set bias voltages periodically to counteract parasitic effects, such as leakage.

3. The bias voltage generator device of claim 2, wherein the controller is adapted to couple multiple sample-and-hold circuits simultaneously to the voltage ramp generator to provide the same set bias voltage to multiple terminals coupled to these multiple sample-and-hold circuits.

4. The bias voltage generator device of claim 1, wherein the voltage ramp generator comprises a digital-to-analogue converter (DAC) having an output coupled to each of said series of terminals via the sample-and-hold circuits for providing the set bias voltage to each terminal.

5. The bias voltage generator device of claim 4, wherein the voltage ramp generator comprises an integrating digital-to-analogue converter (DAC), in particular comprising multiple input capacitors.

6. The bias voltage generator device of claim 4, wherein the voltage ramp generator comprises an integrating digital-to-analogue converter (DAC) with variable slope, in particular comprising a switched-capacitor implementation.

7. The bias voltage generator device of claim 1, wherein the voltage ramp generator is adapted for providing a voltage with a variable slope over time, for moving faster over voltage ranges that are not needed by any of the output terminals, or the voltage ramp generator is adapted for providing discontinuous voltage ranges or completely skip voltage ranges.

8. The bias voltage generator device of claim 1, wherein the voltage ramp generator comprises a switched capacitor integrator.

9. The bias voltage generator device of claim 7, wherein the voltage ramp generator comprises at least one selected from a variable input capacitance, a variable integrator input, a variable integrating capacitor and a combination thereof for dynamically changing the slope of the voltage ramp.

10. A bias voltage generator device comprising a voltage ramp generator for generating a voltage ramp and coupled to a series of terminals for providing a set bias voltage to each terminal, wherein each terminal is coupled to the voltage ramp generator via a sample-and-hold circuit (S&H) for holding a sampled voltage, and a controller adapted to switch each sample-and-hold circuit at a set time to the voltage ramp generator to set the sampled voltage as the set bias voltage, with the voltage ramp generator adapted to provide the voltage ramp to span a required set bias voltage range;

wherein the voltage ramp generator comprises a switched capacitor integrator; and wherein the voltage ramp generator comprises an amplifier comprising a dynamically biased output stage connected to a higher supply voltage for generating a voltage ramp that goes above the nominal supply voltage (VDD) of the adopted fabrication process.

11. The bias voltage generator device of claim 1, wherein the voltage ramp generator comprises an output stage comprising cascode transistors, the output stage adapted for operating in a nominal operating region, in particular wherein the bias voltages of the cascode transistors change as function of the output voltage ramp, which allow the devices in the output stage to operate in their nominal operating region.

12. The bias voltage generator device of claim 10, wherein the bias voltages of the output stage cascode transistors are generated on-chip using the higher supply, a supply that is higher than the nominal supply voltage of the adopted process.

13. The bias voltage generator device of claim 10, wherein diode connected transistors and cascode transistors with proper bias voltages are used in the circuit supplied by a supply voltage higher than the nominal supply voltage to guarantee all transistors operate in their nominal operating region.

14. The bias voltage generator of claim 10, wherein the generated bias voltage depends on the threshold voltage of a transistor, such that it is robust against variations of the threshold voltage when operating at cryogenic temperatures.

15. The bias voltage generator device of claim 1, wherein the Sample-and-hold circuits comprise a demultiplexer (DEMUX).

16. The bias voltage generator device of claim 1, wherein the sample-an-hold circuits and voltage ramp generator are implemented as an integrated circuit.

17. A method for providing a series of set voltages to a series of components according to claim 2, comprising providing a series of terminals each provided with a sample-and-hold circuit, each sample-and-hold circuit individually switchably coupled to a voltage ramp generator, and a controller switching each sample-and-hold circuit at a set time to the voltage ramp generator to set the sampled voltage as the set bias voltage, wherein said controller is operated to provide a set bias voltage to each of the series of terminals.

18. A use of the bias voltage generator device of claim 1 comprising the steps of providing a series of set voltages to a series of cryogenic components of quantum computing devices, including one of a set of spin qubits, quantum dots, quantum-dot based qubits, or quantum sensors.

* * * * *